US007812441B2

(12) United States Patent
Carta et al.

(10) Patent No.: US 7,812,441 B2
(45) Date of Patent: Oct. 12, 2010

(54) SCHOTTKY DIODE WITH IMPROVED SURGE CAPABILITY

(75) Inventors: Rossano Carta, Turin (IT); Luigi Merlin, Turin (IT); Laura Bellemo, Canavese (IT)

(73) Assignee: Siliconix Technology C.V., Singapore (SG)

( * ) Notice: Subject to any disclaimer, the term of this patent is extended or adjusted under 35 U.S.C. 154(b) by 0 days.

(21) Appl. No.: 11/481,194

(22) Filed: Jul. 5, 2006

(65) Prior Publication Data

US 2007/0007614 A1 Jan. 11, 2007

Related U.S. Application Data

(63) Continuation-in-part of application No. 11/255,021, filed on Oct. 20, 2005, now Pat. No. 7,394,158.

(60) Provisional application No. 60/620,756, filed on Oct. 21, 2004, provisional application No. 60/696,634, filed on Jul. 5, 2005.

(51) Int. Cl.
*H01L 23/48* (2006.01)

(52) U.S. Cl. ............................. 257/706; 257/E23.037

(58) Field of Classification Search ................. 257/706, 257/E23.037, E23.051
See application file for complete search history.

(56) References Cited

U.S. PATENT DOCUMENTS

| 4,206,540 | A | * | 6/1980 | Gould .......................... 438/570 |
| 6,432,750 | B2 | | 8/2002 | Jeon et al. |
| 6,624,522 | B2 | | 9/2003 | Standing et al. |
| 6,791,167 | B2 | | 9/2004 | Hayashi et al. |
| 2002/0109211 | A1 | | 8/2002 | Shinohara |
| 2003/0075783 | A1 | | 4/2003 | Yoshihara et al. |
| 2004/0063240 | A1 | * | 4/2004 | Madrid et al. ................ 438/106 |
| 2004/0104489 | A1 | * | 6/2004 | Larking ....................... 257/787 |
| 2004/0169262 | A1 | * | 9/2004 | Oliver et al. ................. 257/676 |
| 2006/0086939 | A1 | * | 4/2006 | Carta et al. ..................... 257/77 |

FOREIGN PATENT DOCUMENTS

WO 97/27626 7/1997

* cited by examiner

*Primary Examiner*—Thomas L Dickey

(57) ABSTRACT

An SiC Schottky diode die or a Si Schottky diode die is mounted with its epitaxial anode surface connected to the best heat sink surface in the device package. This produces a substantial increase in the surge current capability of the device.

15 Claims, 15 Drawing Sheets

SCHOTTKY DIODE WITH IMPROVED SURGE CAPABILITY

RELATED APPLICATIONS

This application is a continuation-in-part of U.S. patent application Ser. No. 11/255,021, filed Oct. 20, 2005, now U.S. Pat. No. 7,394,158, issued on Jul. 1, 2008, which claims the benefit and priority of U.S. Provisional Application No. 60/620,756, filed on Oct. 21, 2004. This application claims the benefit and priority of U.S. Provisional Application No. 60/696,634, filed Jul. 5, 2005 the entire disclosure of which is incorporated by reference herein.

FIELD OF THE INVENTION

This invention relates to semiconductor devices and more particularly relates to a structure to improve the surge capability of a Schottky diode.

BACKGROUND OF THE INVENTION

Silicon Carbide (SiC) Schottky diodes are well known and have reduced switching losses, increased breakdown voltage and reduced volume and weight as compared to their silicon (Si) counterparts. Such devices are therefore replacing Si Schottky devices in numerous applications such as converter/inverters, motor drives, and the like.

However, higher voltage SiC Schottky diodes, such as those rated at 600 volts, for example, have a reduced surge capability than the equivalent Si device. Thus, in an application such as an AC/DC power factor correction circuit, where surge ruggedness is important, the surge capability of the conventional SiC Schottky diode was reduced by a factor of 4, compared to the equivalent Si Schottky diode.

BRIEF SUMMARY OF THE INVENTION

In accordance with the present invention, a SiC Schottky die or even a silicon (Si) Schottky die is mounted in a package which is arranged to more effectively remove heat from its epitaxial anode side, which is the hottest side of the die thereby to reduce the effect of "self heating", which we have recognized is the source of the reduced surge capability of the SiC Schottky diode and the equivalent Si Schottky die.

This is accomplished by mounting the die with its anode side well coupled to a conductive heat sink surface. Thus, a SiC die or a Si die may be inverted from its usual orientation and the guard ring surrounding the active area is well insulated so that the active anode area can be soldered or secured with a conductive adhesive to the heat sink surface without shorting the guard ring. The support surface may be a conventional lead frame as used for a TO-220 type package, or the like, or may be the interior surface of the conductive "can" of a DirectFET® type housing. Such DirectFET® type housings or packages are shown in U.S. Pat. No. 6,624,522 (IR-1830) the disclosure of which is incorporated herein in its entirety.

To ensure good electrical and/or thermal connection of the anode to the heat sink surface, a solderable top metal of the type shown in copending application Ser. No. 11/255,021, filed Oct. 20, 2005 (IR-2769), now U.S. Pat. No. 7,394,158, issued on Jul. 1, 2008, the entirety of which is incorporated herein be reference, is formed on the anode surface of the die, particularly a SiC die.

DETAILED DESCRIPTION OF THE PREFERRED EMBODIMENT

We performed a thermal and electrical analysis of SiC Schottky diodes and learned that the reduction in their surge capability, as compared to equivalent Si devices is related to the "self heating" of the die under high current and relatively long pulse conditions when the die is unable to effectively dissipate the heat produced. This limitation on device performance during forward conduction since, at high current, the positive temperature coefficient forces a thermally reduced voltage drop which increases until device destruction.

This is due to the characteristic of SiC (of any of the various polytypes such as 4H, 3C, 6H and others) and is strongly dependent on temperature particularly with lightly doped material as is normally found in the top epitaxially grown layer of a typical SiC devices.

Figure 1:
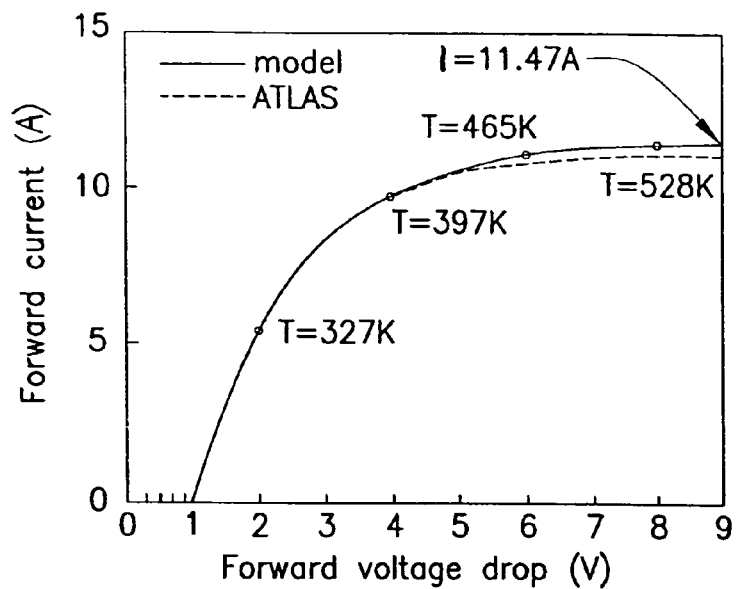
FIG. 1 shows a SiC Schottky diode forward voltage drop and forward current at a plurality of different temperatures.

Thus, as shown in FIG. 1, we have recognized from calculation and simulation the strong effect of temperature on the forward voltage drop and forward current due to self heating ($R_{th}$=2.5 K/W). In FIG. 1, current saturation is apparent.

The effect is strongly dependent on lightly doped material, (i.e. the epitaxial layer carrying the anode contact of the Schottky. Thus, mobility in this layer decreases with temperature according to the following formula:

$$\mu(T) = \mu_o \left[\frac{T}{300}\right]^{-2.5}$$

where $\mu_o$=400.

From the above, it can be seen that the high mobility at high junction temperatures $T_j$ will lead to high resistivity high forward voltage drop $V_f$ and poor surge capability. It should be noted that the same analysis applies to the Si Schottky die as well as the SiC Schottky die and the benefits of the invention apply equally.

In accordance with the invention, and with the above understanding, it is critically necessary to improve the cooling of the epitaxial silicon side of the die (the anode) since that is the hottest side of the die. Thus, the epitaxial side of the die must contact the best heat dissipation surface available in the package for the die. Thus, in a plastic package, this would be the lead frame supporting the die, or the interior top surface of the can in a DirectFET® type package.

To this end, the SiC or other die must be flipped with the epitaxial layer in the position of the cathode in the standard package. The top metal on the epitaxial surface is preferably solderable, for example, using the solderable top metal disclosed in application Ser. No. 11/255,021, filed Oct. 20, 2005 (IR-2769), now U.S. Pat. No. 7,394,158, issued on Jul. 1,2008. The device back metal, now on the cathode side of the die may be any suitable bondable metal.

When flipped die is used, special protection is needed to prevent the device termination region from contacting the lead frame. As will be shown, a suitable epoxy passivation mask, or the like can be used.

Figure 4:
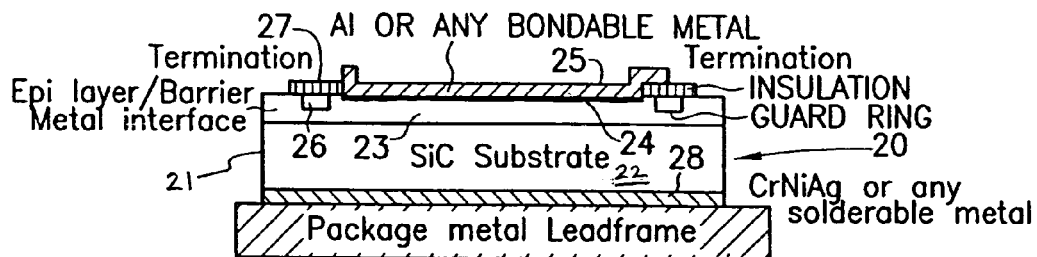
FIG. 4 is a cross-section of a SiC Schottky diode of the prior art in which the anode layer, or epitaxially formed layer faces away from the main package heat sink.

Referring next to FIG. 4, there is shown a prior art SiC Schottky diode device 20 and at least a portion of the package for the device. The Schottky die is shown as die 21, having a substrate 22 and a top epi layer 23. The resistivity and thickness of the SiC is based on the blocking voltage required, for example, 600 volts. A barrier metal interface 24 is a top epi layer 23 and receives a suitable anode contact 25, which may be Al or any bondable metal. The active area of the device is terminated by a diffused termination guard ring 26 which is passivated by a suitable insolation layer 27, which could be an oxide. A similar structure is present in the Si Schottky die.

The cathode side of substrate 22 receives a cathode electrode 28 which can, for example, be a tri-layer of CrNiAg or any suitable solderable metal.

The package for die 21 will include a heat sinking surface such as the metal lead frame 30 in FIG. 4. Any other metal layer of the package will serve as a good heat sink for die 21, and in FIG. 4, the die 21 is soldered or secured by a conductive cement or epoxy to lead frame 30 so that a good thermal connection is obtained. Frequently, the heat sink 30 will also serve as a cathode contact for the package.

The package is then completed in any desired manner to fully house the die 21.

As pointed out previously, this structure has produced unexpectedly poor surge capability.

Figure 5:
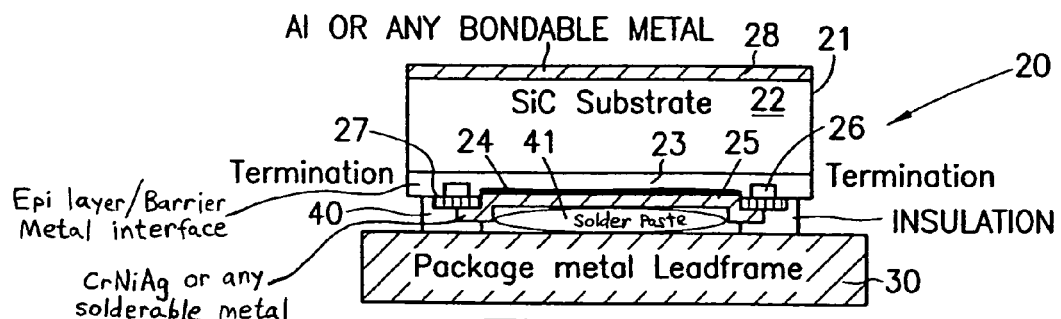
FIG. 5 shows the structure of FIG. 4 where the die is flipped over, and the hotter epi surface side of the die faces and is thermally coupled to the main heat sink surface of the device package or assembly.

In accordance with the invention, and as shown in FIG. 5. the die 21 of FIG. 4 is flipped so that the epi side 23 of the die makes contact with the best heat sink surface of the package.

In FIG. 5, components identical to those of FIG. 4 have the same identifying numeral. However, an epoxy passivation mass 40 is added around the edge of contact 25 and under termination passivation 27 to prevent the accidental contact of guard ring 26 to metal body 30. A solder paste 41 is also employed to thermally and electrically connect anode contact 25 to heat sink 30.

Figure 2:
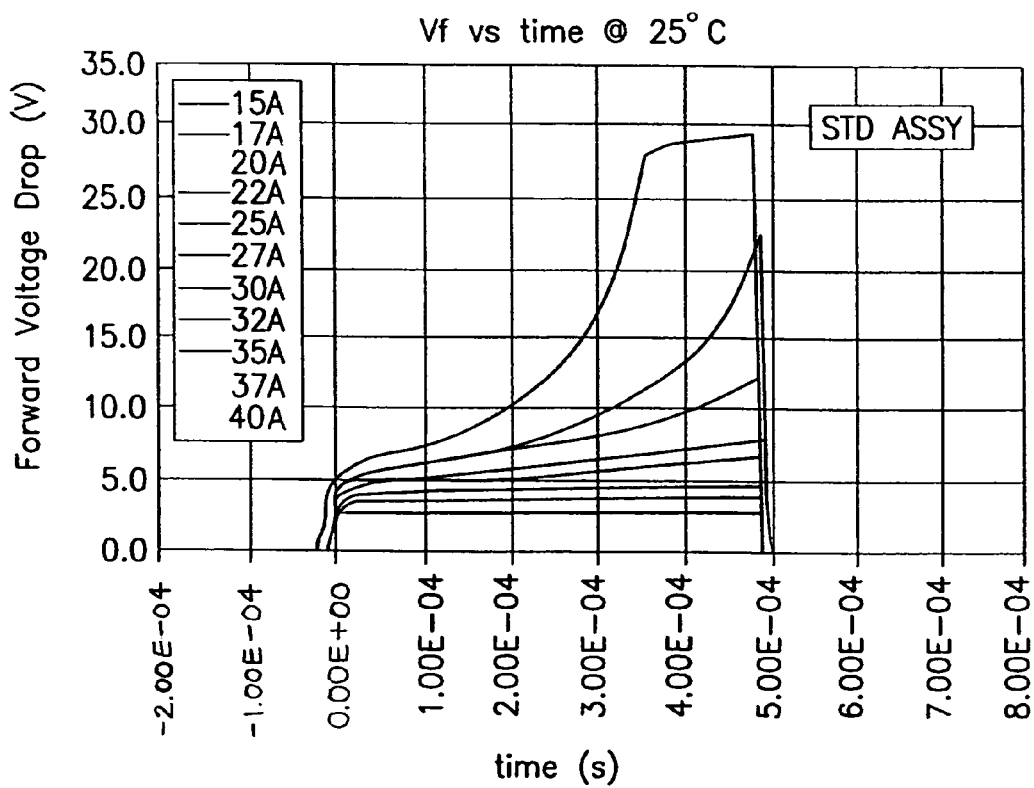
FIG. 2 shows a measured forward voltage drop as a function of time for different values of 0.5 m sec. pulses of forward current at 25° C. in the prior art package of FIG. 4.

FIG. 2 shows the forward voltage drop for the device of FIG. 4 as a function of time for different current values of 0.5 m sec. current pulses at 25° C. The plural curves shown are for pulses of 15 amperes (the bottom-most line) to 40 amperes (the top most line), with intermediate pulse currents of 17, 20, 22, 25, 27, 30, 32,35 and 37 amperes. Note the dramatic increase in forward voltage drop at the 37 and 40 ampere levels.

Figure 3:
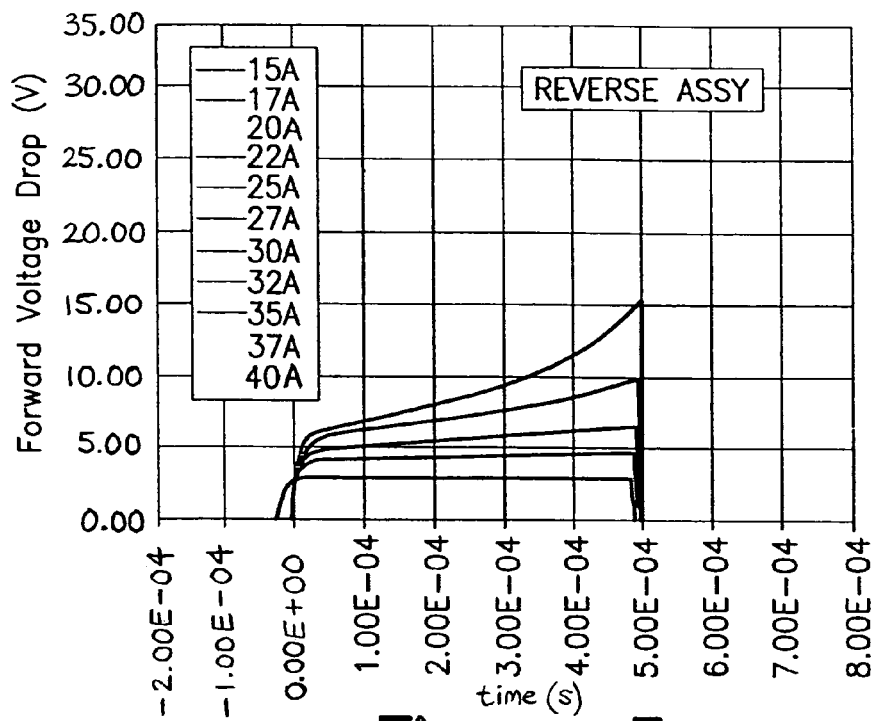
FIG. 3 is like FIG. 2 but shows a reduced forward voltage drop when the Schottky die is mounted in accordance with the invention as shown in FIG. 5.

FIG. 3 shows curves like those of FIG. 2 for the die of FIG. 5, containing the novel invention. Note the substantially reduced forward voltage drop and thus the reduced heating of the die at the higher current pulse values.

Figure 6A:
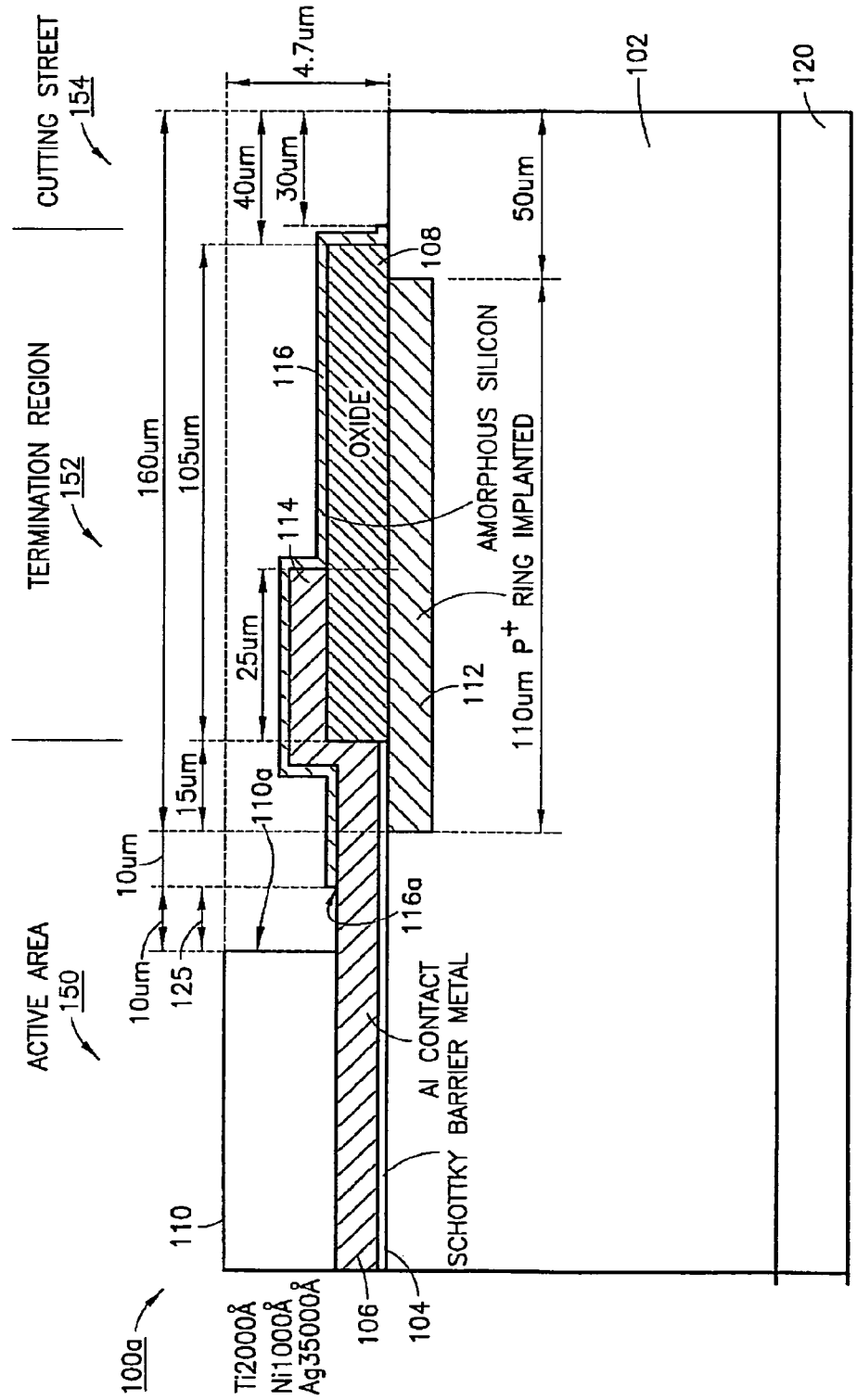
FIG. 6A shows a cross-sectional view of a portion of a semiconductor device according to an embodiment of the invention.

Referring to FIG. 6A, there is shown in cross section a small portion of a semiconductor device 100a according to a preferred embodiment of the present invention (note that the dimensions shown in FIG. 6A are for example purposes and that device 100a is not drawn to scale). As an example, device 100a is a SiC Schottky diode with a single ring field plate termination and a blocking voltage of about 600V, and may be a 6 Å device with a die size of about 1450×1450 um. Nonetheless, one skilled in the art will recognize that the present invention is not limited to SiC Schottky diodes and is not limited to these dimensions.

As shown in FIG. 6A, device 100a includes a SiC substrate 102. As an example, substrate 102 may have the following parameters, although one skilled in the art will recognize that the invention is not limited to these parameters: Cs bulk 0.019 ohm/cm=3E18T×350μ; Epi 7μ concentration doping 9E15 dopant type nitrogen; and Epi 7 um. On the top surface of substrate 102 along active area 150 is a Schottky barrier metal 104, made of titanium for example, which forms a Schottky contact with substrate 102. As an example, device 100a may have a Ti barrier length of 1.01 eV. Formed over Schottky barrier metal 104 is contact metal 106. This contact metal may be made of aluminum, for example, and may have a thickness of 1 um, for example. Contact metal 106 forms the anode power electrode of device 100a and acts as a diffusion barrier that protects Schottky barrier metal 104 from interactions from other metals, such as solderable contact 110.

A termination region 152 surrounds the periphery of active area 150 and includes a field oxide ring 108 formed along the top surface of substrate 102, which oxide ring may have a thickness of about 7000 Å, for example. Termination region 152 further includes a guard ring 112 of P+ conductivity formed within the top surface of substrate 102. The guard ring extends along field oxide ring 108 and under a portion of Schottky barrier metal 104. As shown in FIG. 6A, a portion of contact metal/anode electrode 106 extends within termination region 152 and over a portion of the top surface of field oxide ring 108, thereby forming field plate 114. A semi insulating passivation layer 116 overlies the exposed top and side surfaces of field oxide ring 108 and field plate 114. Passivation layer 116 also extends over the outer peripheral edge of anode power electrode 106 and in this way, surrounds the outer peripheral edge of the electrode. Passivation layer 116 may have a thickness of about 1900 Å, for example, and may be an amorphous silicon layer, for example.

Along the bottom surface of substrate 102 is a conventional contact metal 120 that forms a cathode electrode.

Device 100a further includes a solderable contact 110 that is deposited on a top surface of the anode electrode 106 and that may extend, for example, about 4.7 um above the top surface of substrate 102. This solderable contact may be, for example, a silver-containing contact, such as a trimetal stack containing silver. As an example, the trimetal stack may be a titanium/nickel/silver stack each with a respective thickness of about 2000 Å, 1000 Å, and 35000 Å, for example. Alternatively, the trimetal stack may be a chromium/nickel/silver stack, or some other conventional trimetal stack known in the art.

Figure 6B:
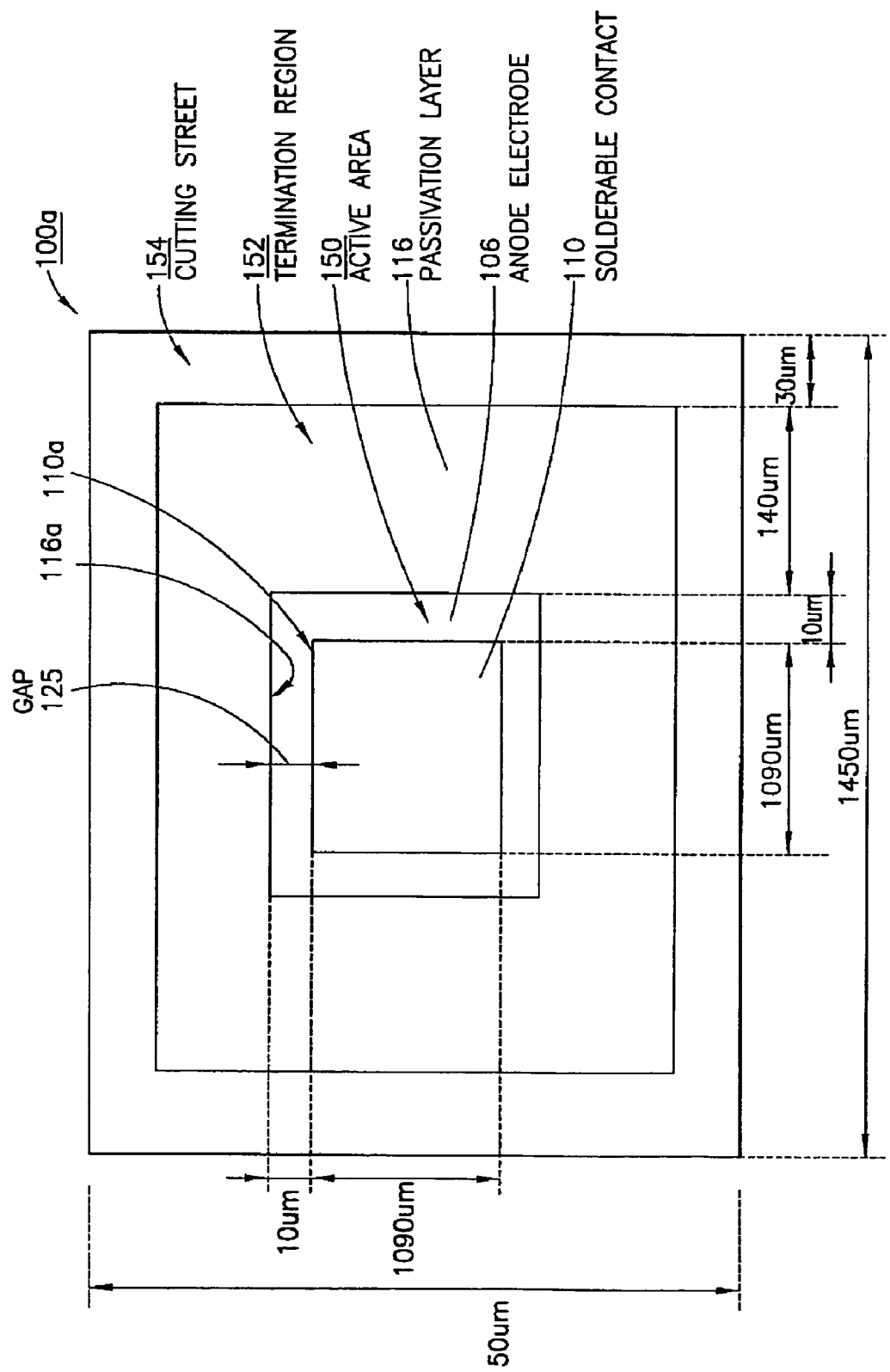
FIG. 6B shows a top plan view of the semiconductor device of FIG. 6A, with FIG. 6B showing the complete top surface of the device.

According to an embodiment of the present invention and as shown in FIG. 6A, solderable contact 110 may be formed such that the edge/side 110a of the solderable contact is a spaced distance from the confronting/adjacent edge/side 116a of passivation layer 116, thereby forming a gap/opening 125 therebetween. Gap 125 preferably extends vertically to the top surface of anode electrode 106, thereby exposing the top surface and the aluminum thereof, assuming the electrode is made of aluminum. As shown in FIG. 6B, which shows a top view of the entire top surface of device 100a, gap 125 preferably surrounds the outer periphery of solderable contact 110, thereby forming, for example, an aluminum frame around the solderable contact (note that the dimensions shown in FIG. 6B are for example purposes). Gap 125 may be from about 5 um to about 80 um wide and preferably, may be about 10 um wide.

Significantly, when solderable contact 110 of device 100a is attached by solder to a clip/strap or a leadframe of a device package, for example, gap 125 assists in containing the solder inside the area of the solderable contact as the solder is reflowed, thereby preventing the solder from extending into termination region 152. In addition, gap 125 exposes the entire top and side surfaces of solderable contact 110, thereby preventing passivation layer 116 from concealing any of the surfaces of the solderable contact. As a result, as solder is applied to the solderable contact and reflowed, the solder is able to cover the entire outer exposed surface of the solderable contact and thereby dissolve the exposed silver along these surfaces and form a solder alloy. In this way, the silver is fully captured within the alloy, limiting the effect of silver ion electromigration and the formation of dendrites over passivation layer 116.

Figure 6C:
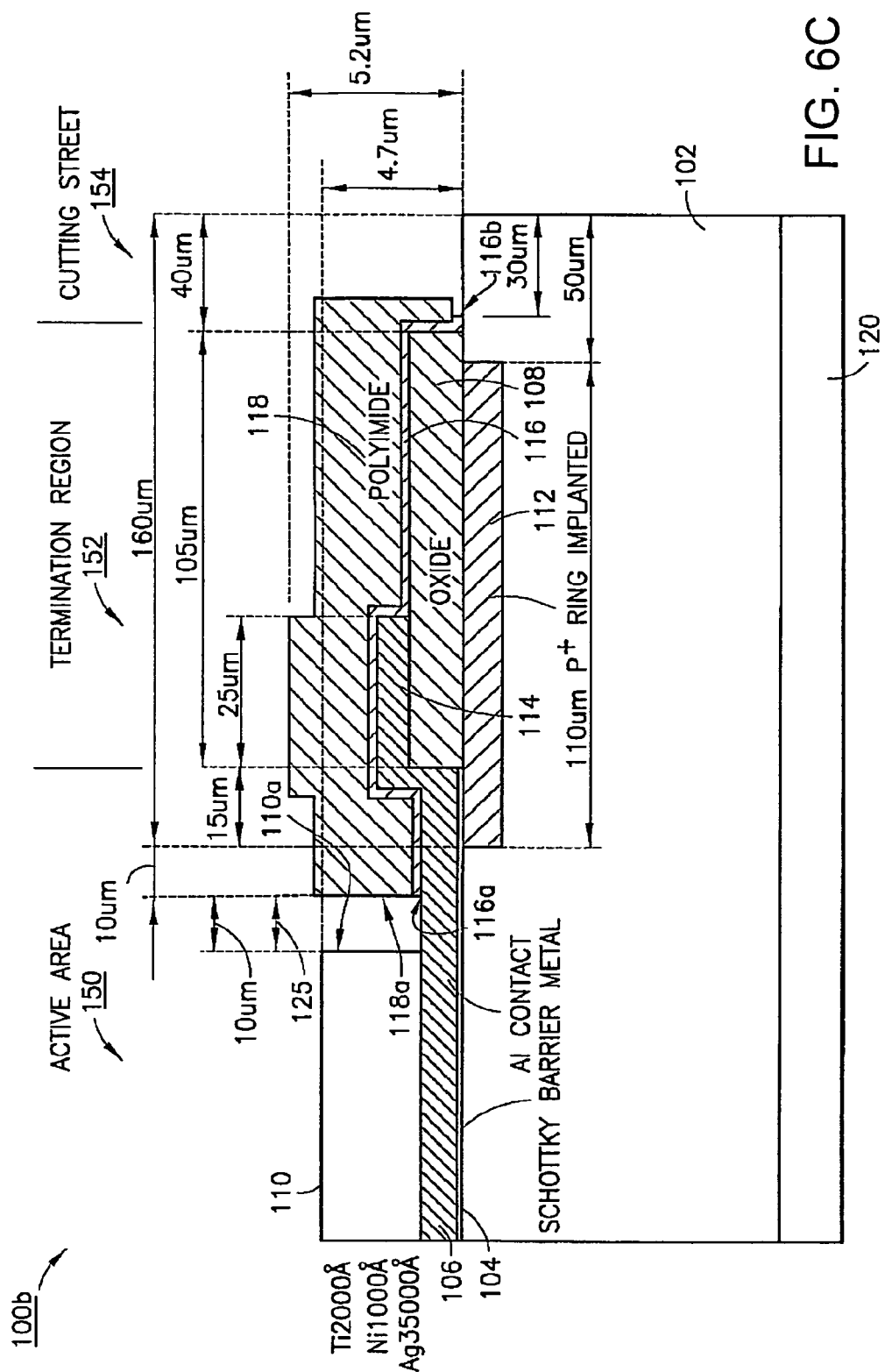
FIG. 6C shows a cross-sectional view of a portion of a semiconductor device according to another embodiment of the invention.

Referring now to FIG. 6C in which like numerals identify like features, there is shown in cross section a portion of a semiconductor device 100b according to an embodiment of the present invention. Device 100b is similar to device 100a and now further includes a second insulating passivation layer 118 formed over passivation layer 116. In particular, passivation layer 118 extends from side/edge 116a of passivation layer 116 along the full length thereof. Alternatively and as shown in FIG. 6C, passivation layer 118 may extend beyond the end 116b of passivation layer 116 and into cuffing street 154, for example, in order to seal the entire termination layer, for example. Passivation layer 118 may be added in cases of high roughness and for reliability needs. Passivation layer 118 may have a thickness of about 3 um substantially over the length thereof, for example, and may be a photo imagable polyimide layer, a PSG (phosphor silicate glass) oxide layer, or a silicon nitride layer, for example, depending on the device application and/or device reliability requirements. According to an embodiment of the invention and as shown in FIG. 6C, the edge/side 118a of passivation layer 118 that is adjacent to side/edge 110a of solderable contact 110 acts to further define gap 125.

The thickness or height of passivation layer 118 is based on the passivation quality of the material from which the layer is formed and on the blocking voltage of the device. Preferably, however, passivation layer 118 has a thickness such that the top surface of the passivation layer at least has the same height as the top surface of solderable contact 110 in the area of gap 125, as shown in FIG. 6C. In this way, gap 125 and side/edge 118a of passivation layer 118 further assist in containing the solder inside the area of the solderable contact 110 as the solder is reflowed, thereby preventing the solder from extending into the termination region.

Figure 7A:
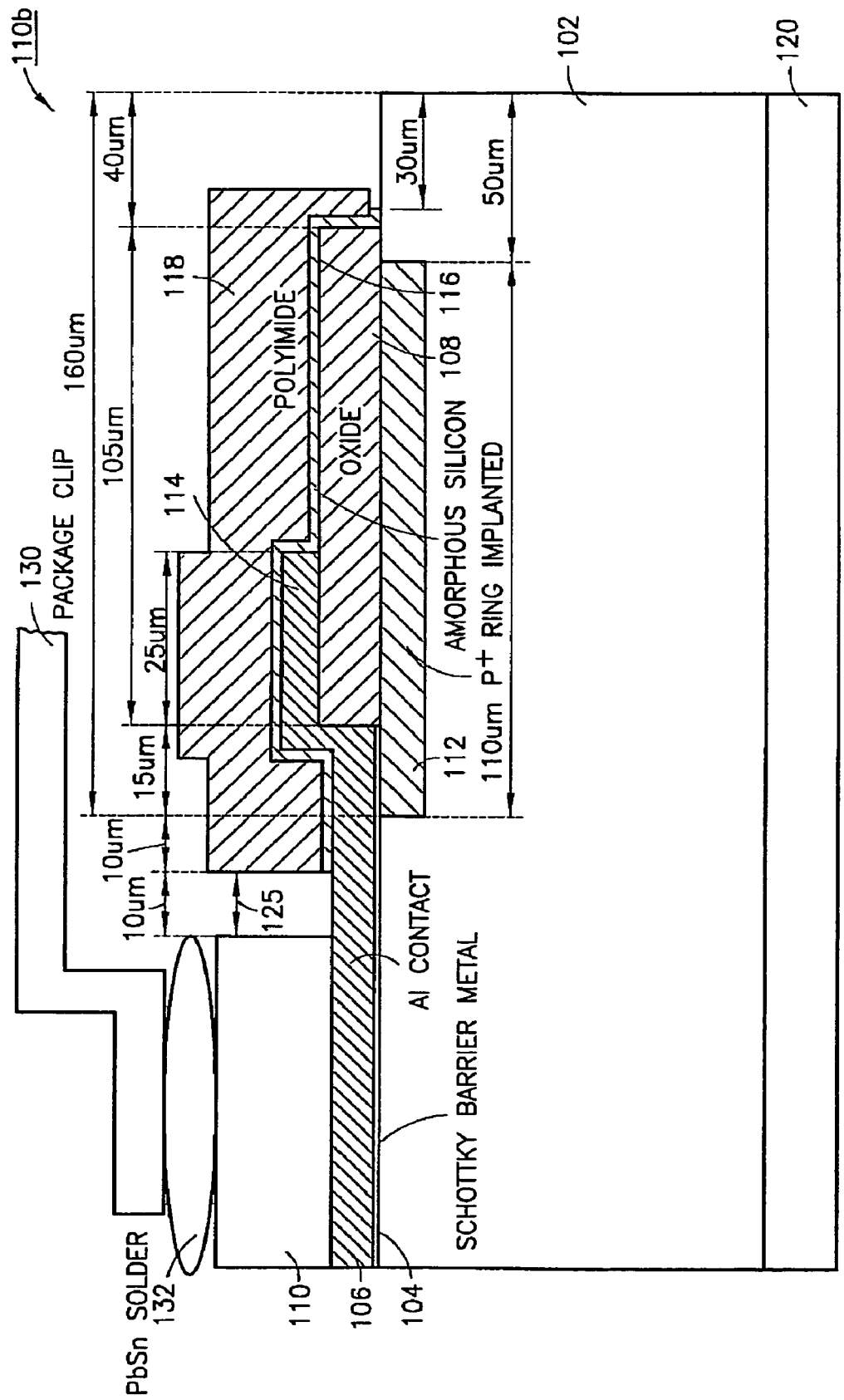
FIGS. 7A and 7B show process steps according to an embodiment of the invention for attaching a package clip to a power electrode of the semiconductor device of FIG. 6C.
Figure 7B:
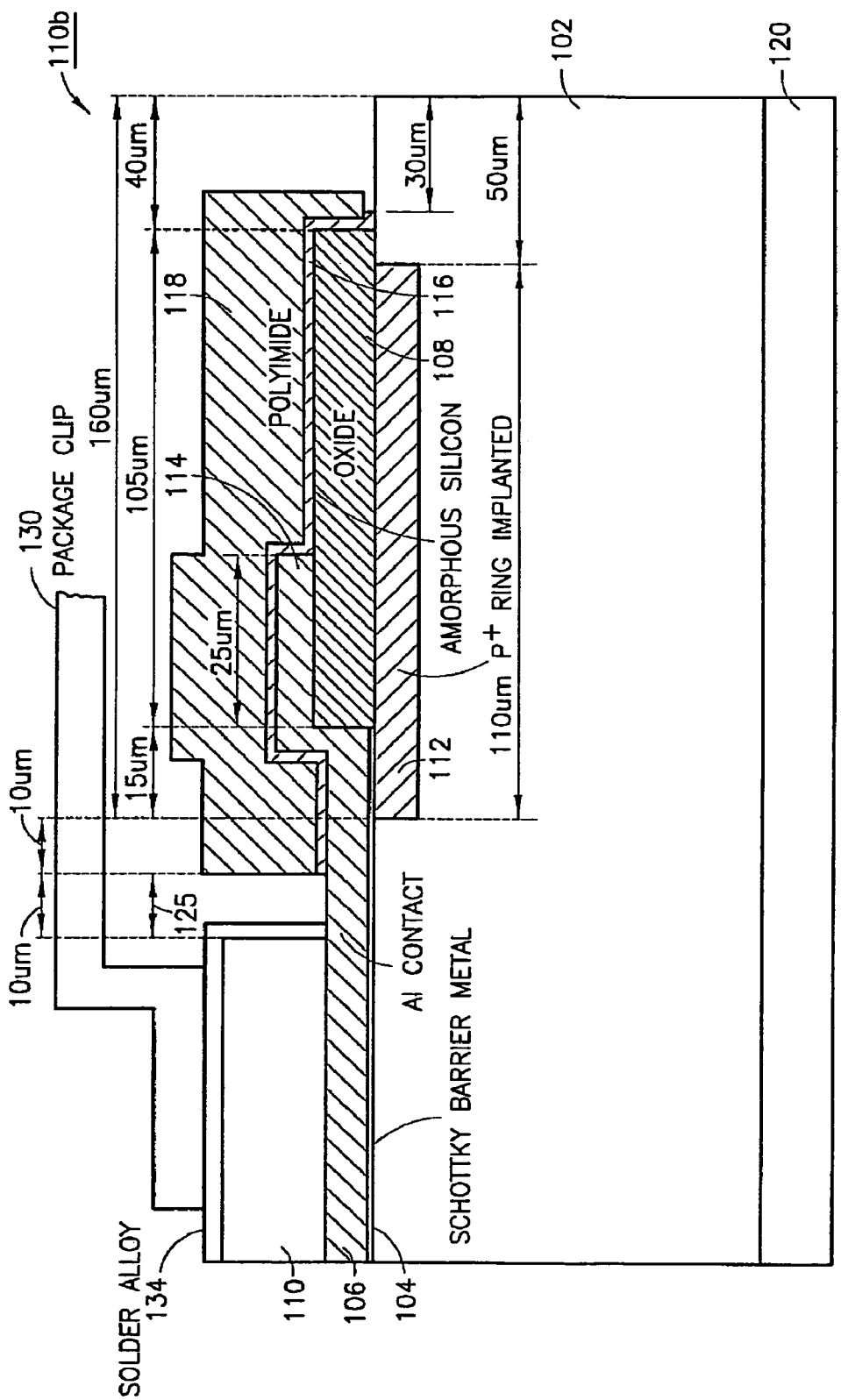

In general, the present invention is applicable to all cases where a solderable contact is needed. For example, referring to FIGS. 7A and 7B, there is shown a clip/strap 130 secured to solderable contact 110 of device 100b according to an embodiment of the invention (note that a clip/strap would be similarly secured to device 100a). Clip/strap 130 may connect anode electrode 106 to the leadframe of a device package, such as a TO220 clip attach package, for example (note that FIG. 6C does not show the interconnection between the clip and leadframe). As shown in FIG. 7A, solder paste 132, for example, is first placed on solderable contact 110 and clip 130 is then placed directly on the surface of the solderable contact. Thereafter, the solder is reflowed to attach the clip to the solderable contact, as shown in FIG. 7B. As illustrated in this FIG. and as described above, as the solder is reflowed, the solder covers the entire outer exposed surface of solderable contact 110, thereby dissolving the exposed silver along these surfaces and forming a solder alloy 134 that helps to prevent the formation of dendrites.

As another example, for a package with a top side leadframe, the leadframe may be placed directly on solderable contact 110 in a similar fashion as shown in FIG. 7A and secured in a similar fashion as shown in FIG. 7B. As a further example, for device packages whereby the SiC die is flipped-chip mounted to a substrate, for example, solderable contact 110 may be placed directly on the pads of the substrate and soldered thereto.

A semiconductor device according to the present invention may be fabricated using substantially the same process steps used to form a comparable device that is packaged using wire bonds (i.e., a bondable device) for example, thereby making the fabrication of a device of the present invention compatible with current SiC processing steps. For example, referring to FIG. 8A, there is shown a partially fabricated SiC Schottky diode that resembles devices 100a and 100b. If a bondable form of the diode is required, the device is completed by applying a contact metal 120 on the bottom surface of the device to form a cathode electrode. Alternatively, several additional fabrication steps may be performed in order to form solderable contact 110 and optionally, passivation layer 118 of the present invention.

Figure 8A:
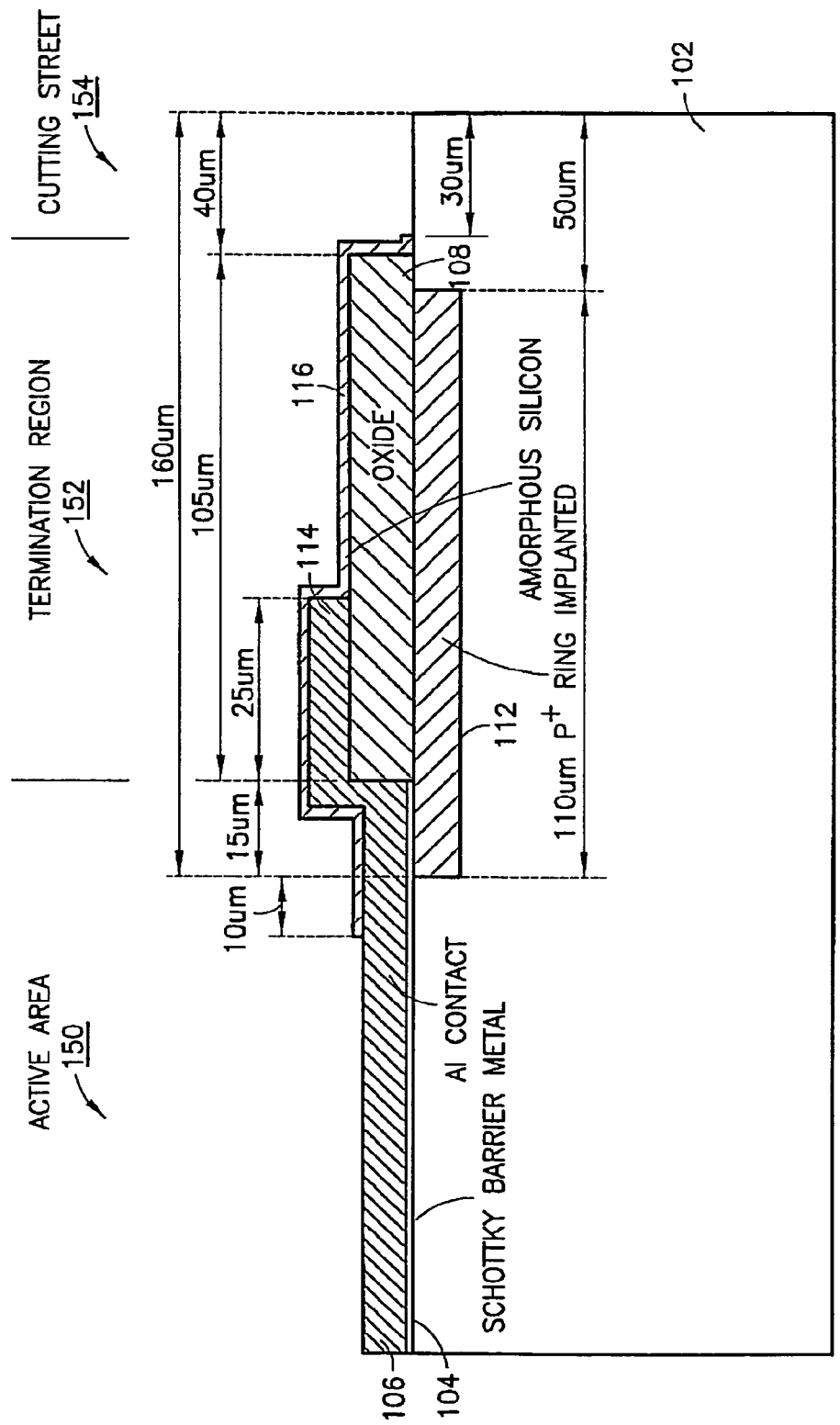
FIGS. 8A, 8B, and 8C illustrate a process according to an embodiment of the invention for fabricating the semiconductor devices of FIGS. 6A and 6C.

In overview and as an example, the device of FIG. 8A may be fabricated according to the following process. First, an oxide-based mask, for example, is formed on the top surface of a SiC substrate 102, which mask has an opening therein along a portion of the termination region 152 and active area 150 to expose the top surface of the substrate. Thereafter, a boron implant, for example, is performed on the top surface of the substrate through the opening. A phosphorus implant, for example, is then performed along the bottom surface of the substrate. Thereafter, the mask on the top surface of the substrate is removed and the boron and phosphorous implants are annealed. As a result, guard ring 112 of $P^{30}$ conductivity is formed in the top surface of the substrate and the bottom surface becomes highly doped, thereby allowing an ohmic contact to be formed when contact metal 120 is deposited on the bottom surface.

Next, a layer of LTO TEOS, for example, is deposited on the top surface of substrate 102 and is thereafter masked and etched to form field oxide ring 108. Next, a Schottky barrier metal layer 104, such as titanium, and a contact metal layer 106, such as aluminum, are deposited on the top surface of the device and are thereafter sintered, forming a Schottky contact along the active area 150. Thereafter, the Schottky barrier metal layer and the contact metal layer are masked and then etched along the termination region 152 and cutting street 154 and the mask then removed, thereby forming anode electrode 106 and field plate 114.

Next, a passivation layer, such as amorphous silicon, is applied over the top surface of the device. The amorphous silicon layer is then masked and etched along the active area and cutting street and the mask then removed. Thereafter, the amorphous silicon is sintered, resulting in the formation of passivation layer 116 and thereby the device shown in FIG. 8A. Again, if a bondable form of the device is required, the device is completed by forming a cathode electrode on the bottom surface thereof. Alternatively, solderable contact 110 and optionally, passivation layer 118, of the present invention may be formed using, for example, the following additional process steps.

Figure 8B:
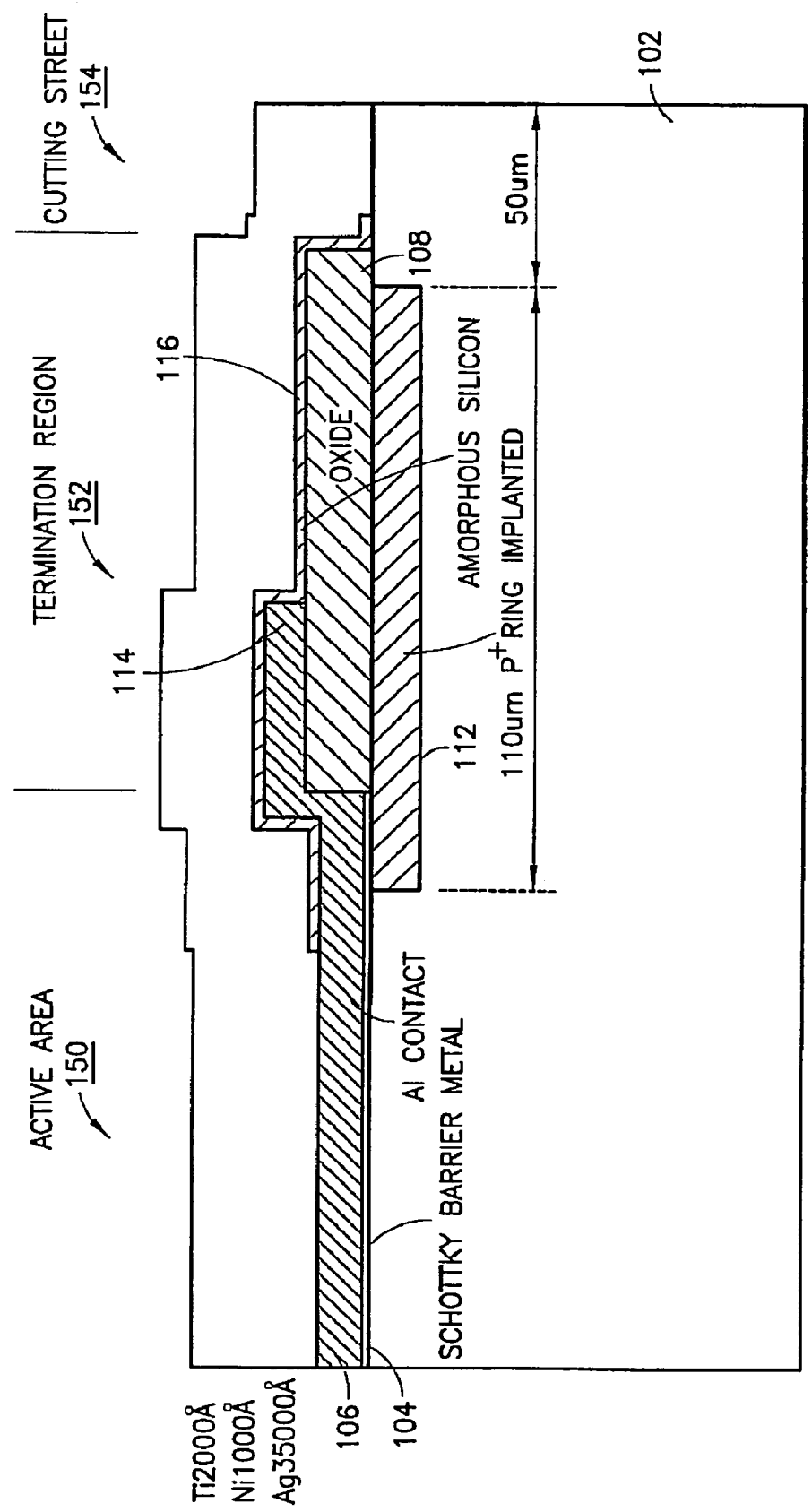

Referring to FIG. 8B, a solderable top metal 136 is applied over the top surface of the device shown in FIG. 8A. Again, this solderable top metal may be a silver-containing trimetal stack, such as a titanium/nickel/silver stack each with a respective thickness, for example, of about 2000 Å, 1000 Å, and 35000 Å. Next, a mask (not shown in the FIGS.) is formed over the surface of the solderable top metal using photolithography, for example, and the metal then etched, removing the metal from the termination region and cutting street and forming solderable contact 110. During the etching process, gap 125 is also formed, separating the solderable contact and passivation layer 116 by a spaced distance. The remaining mask layer over solderable contact 110 is then removed, resulting in the device shown in FIG. 8C. Again, gap 125 preferably extends to the surface of anode electrode 106 and preferably surrounds the periphery of solderable contact 110.

Figure 8C:
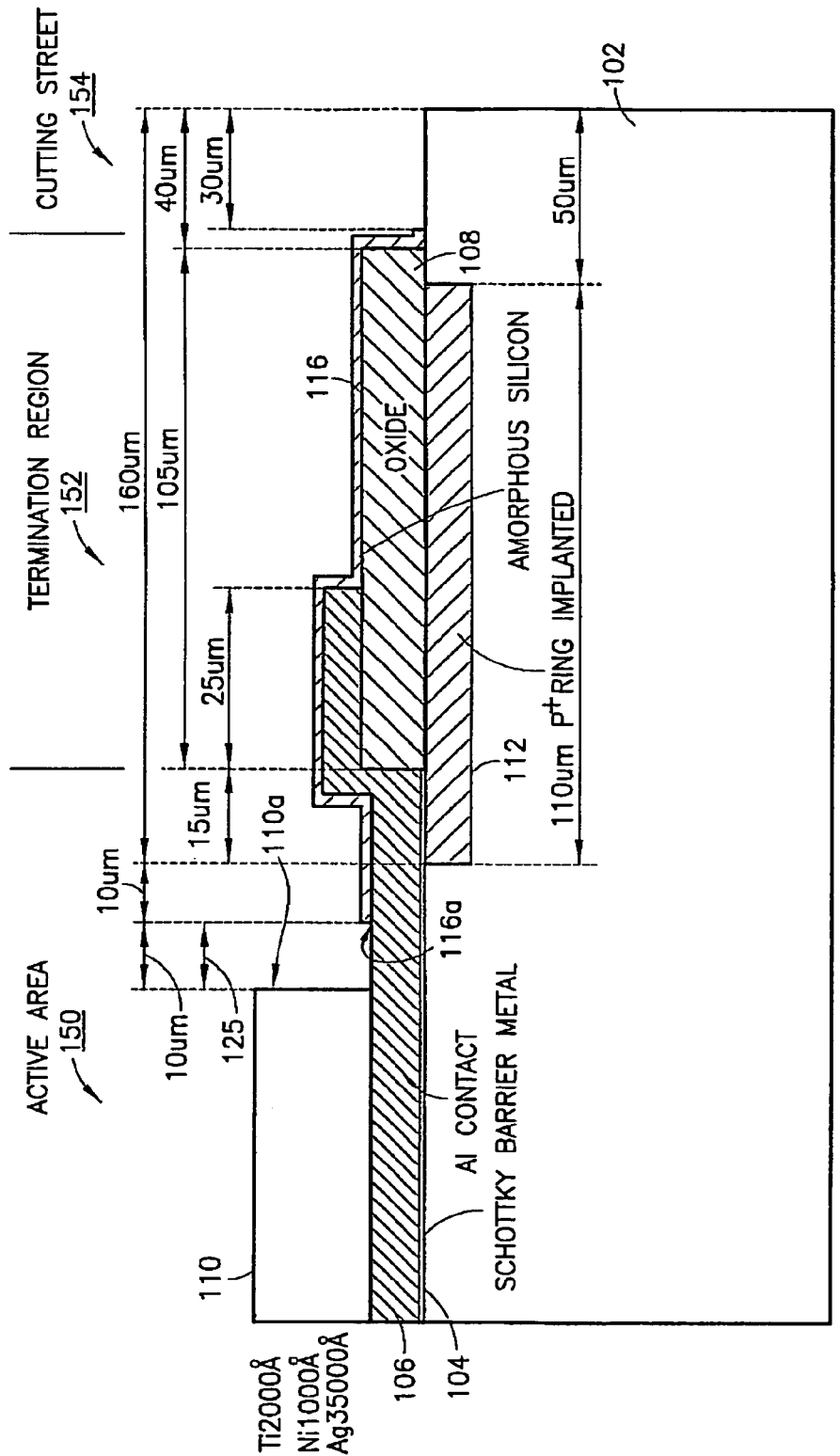

To form device 100a of FIG. 1A, for example, a back side contact metal 120 is finally applied along the bottom surface of the device of FIG. 8C, thereby forming a cathode electrode.

Alternatively, if device reliability/roughness is an issue as described above, a second passivation layer 118 may be formed over the first passivation layer 116, resulting in device 100b of FIG. 6C, for example. Passivation layer 118 may be a photo imagable polyimide layer, a PSG oxide layer, or a silicon nitride layer, for example. Assuming passivation layer 118 is made of photopolyimide, layer 118 is formed by first depositing the photopolyimide over the surface of the device shown in FIG. 8C. A mask is then formed over the surface of the deposited photopolyimide and the photopolyimide layer etched along the active area and cutting street, removing the photopolyimide from the surface of the solderable contact 110, from gap 125, and from cutting street 154, thereby forming passivation layer 118 as shown in FIG. 6C. Passivation layer 118 may extend the full length of passivation layer 116 or may extend beyond the end 116b of passivation layer 116 and into the cutting street, for example. In addition, passivation layer 118 preferably has a thickness such that the top surface of the passivation layer at least has the same height as the top surface of solderable contact 110 in the area of gap 125, as shown in FIG. 6C. However, this thickness is not required and is a function of the passivation material and the blocking voltage of the device, as described above.

To complete device 100b, a back side contact metal 120 is applied along the bottom surface of substrate 102.

As can be seen, the fabrication process for a solderable contact and a second passivation layer of the present invention is compatible with existing SiC process fabrication steps.

One skilled in the art will recognize that a device according to the present invention is not limited to a Schottky diode with a single ring field plate termination, as described above, and is also applicable to Schottky diodes with different forms of field plates, guard rings (e.g., single, multiple, and floating), and JTE terminations, for example. In addition, the present invention is not limited to a 600 V device and in particular, is capable of reliably providing a robust termination and passivation for SiC devices from about 300 V up to about 1600 V. For example, referring to FIGS. 9A-9E, in which like numerals identify like features, there are shown SiC Schottky diodes 400a-400e according to embodiments of the present invention, each diode having an alternative termination (note that the dimensions shown in FIG. 9A-9E are for example purposes and that devices 400a-400e are not drawn to scale). Similar to devices 100a and 100b, devices 400a-400e each has a solderable contact 110 and a gap 125 formed between this contact and adjacent passivation layers 116 and 118. Note that while devices 400a-400e are shown as including passivation layer 118, this passivation layer is not required.

Figure 9A:
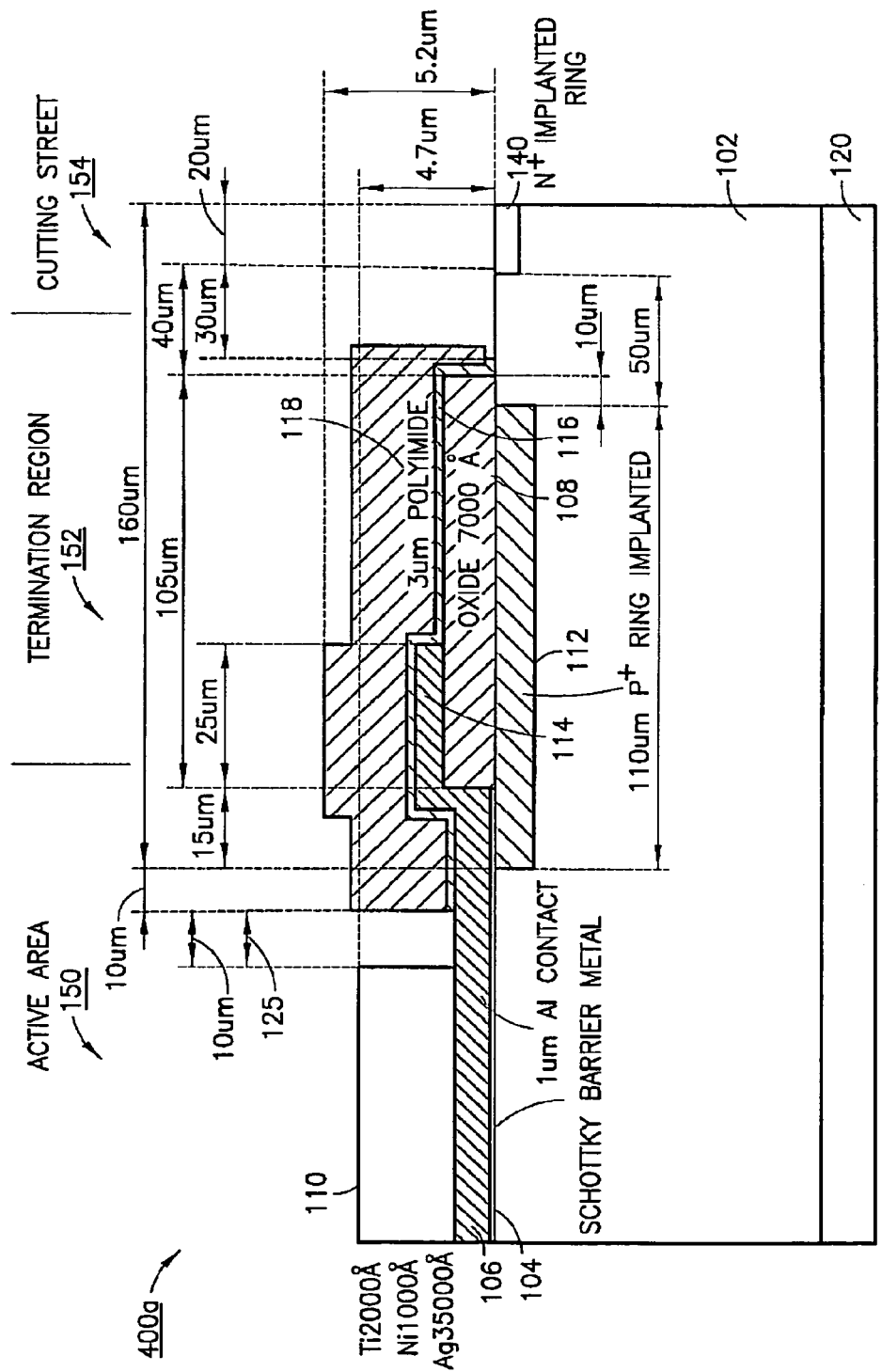
FIGS. 9A, 9B, 9C, 9D, and 9E show cross-sectional views of portions of semiconductor devices according to embodiments of the invention, the devices of FIGS. 9A, 9B, 9C, 9D, and 9E having different terminations.
Figure 9B:
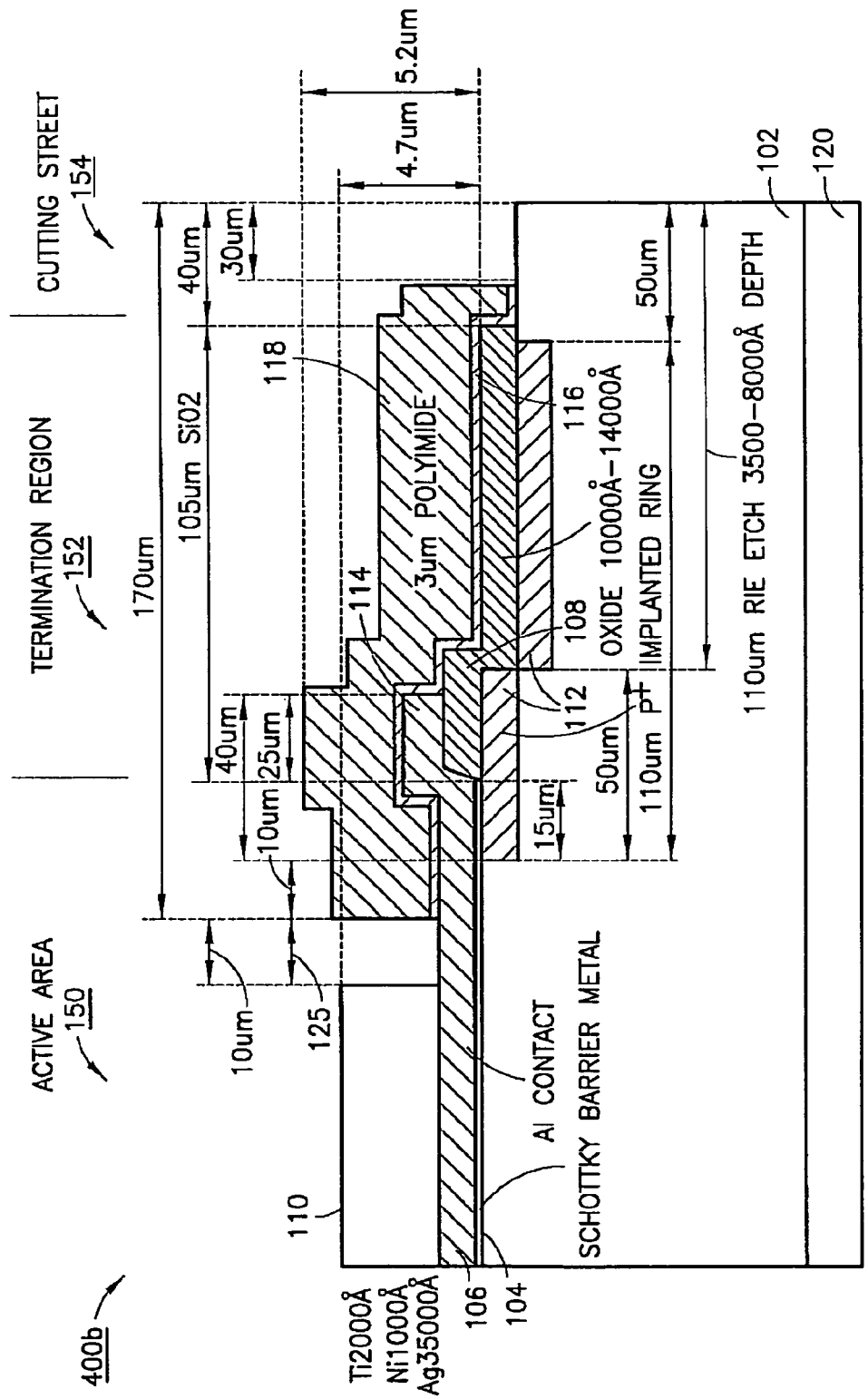
Figure 9C:
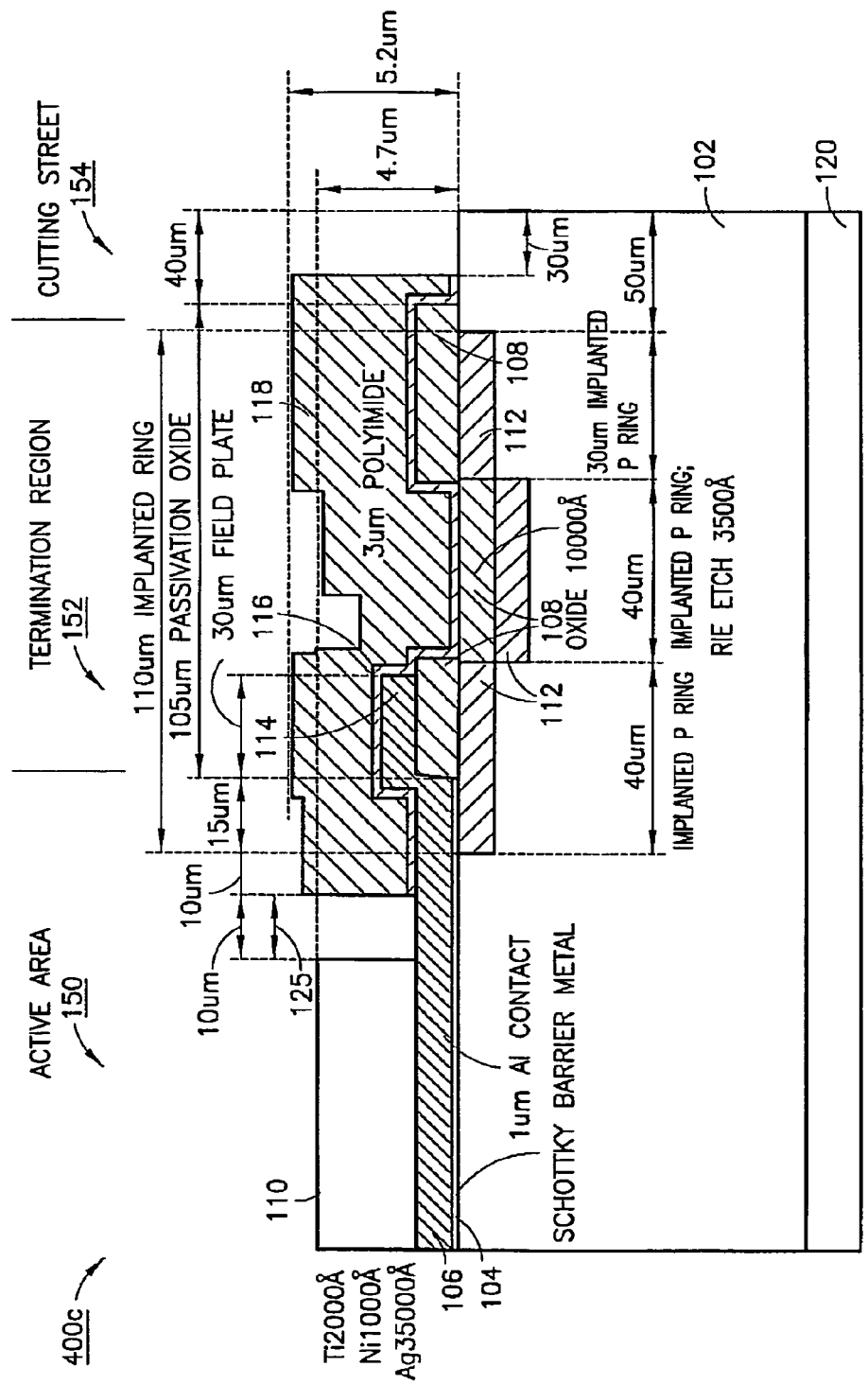
Figure 9D:
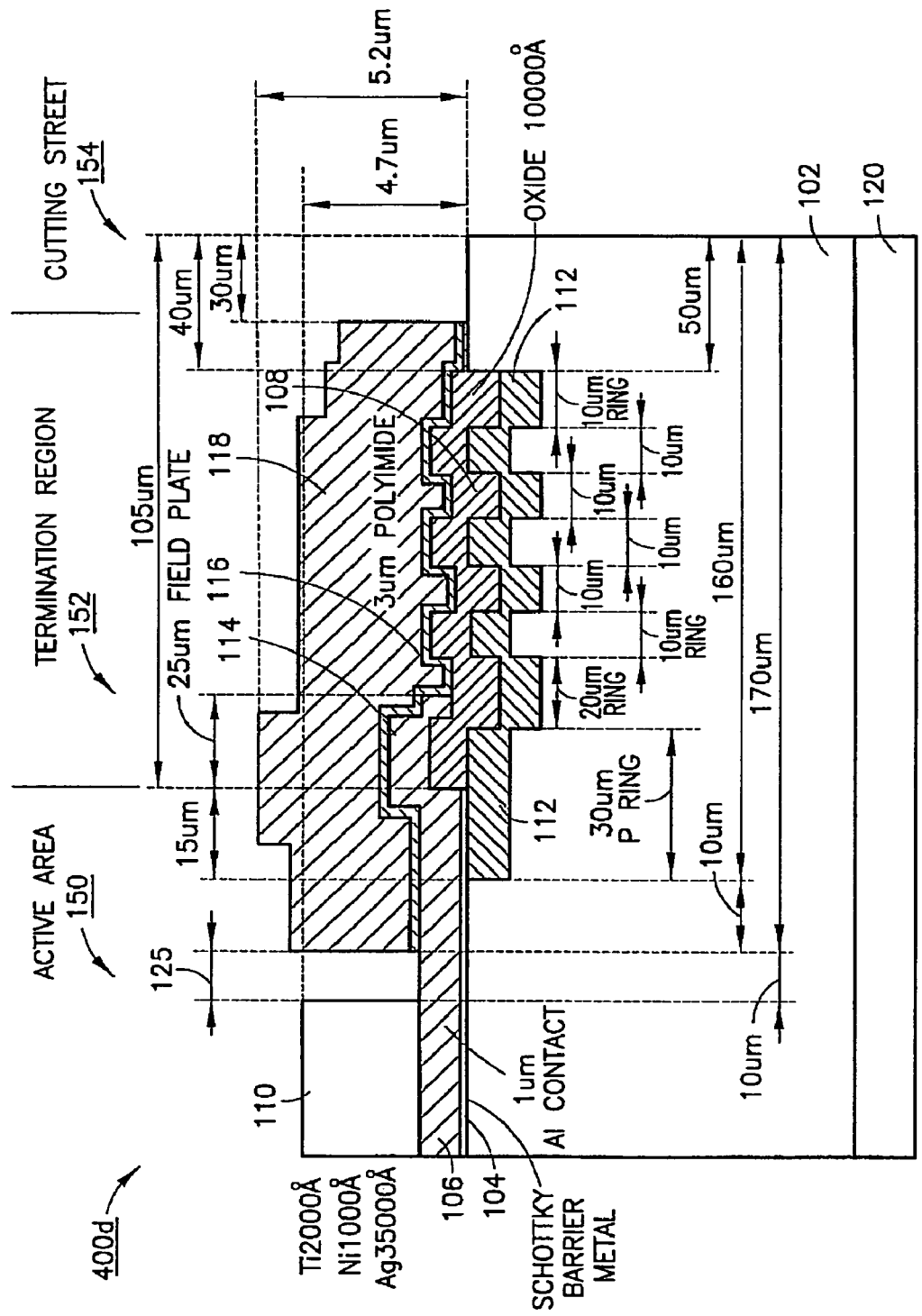
Figure 9E:
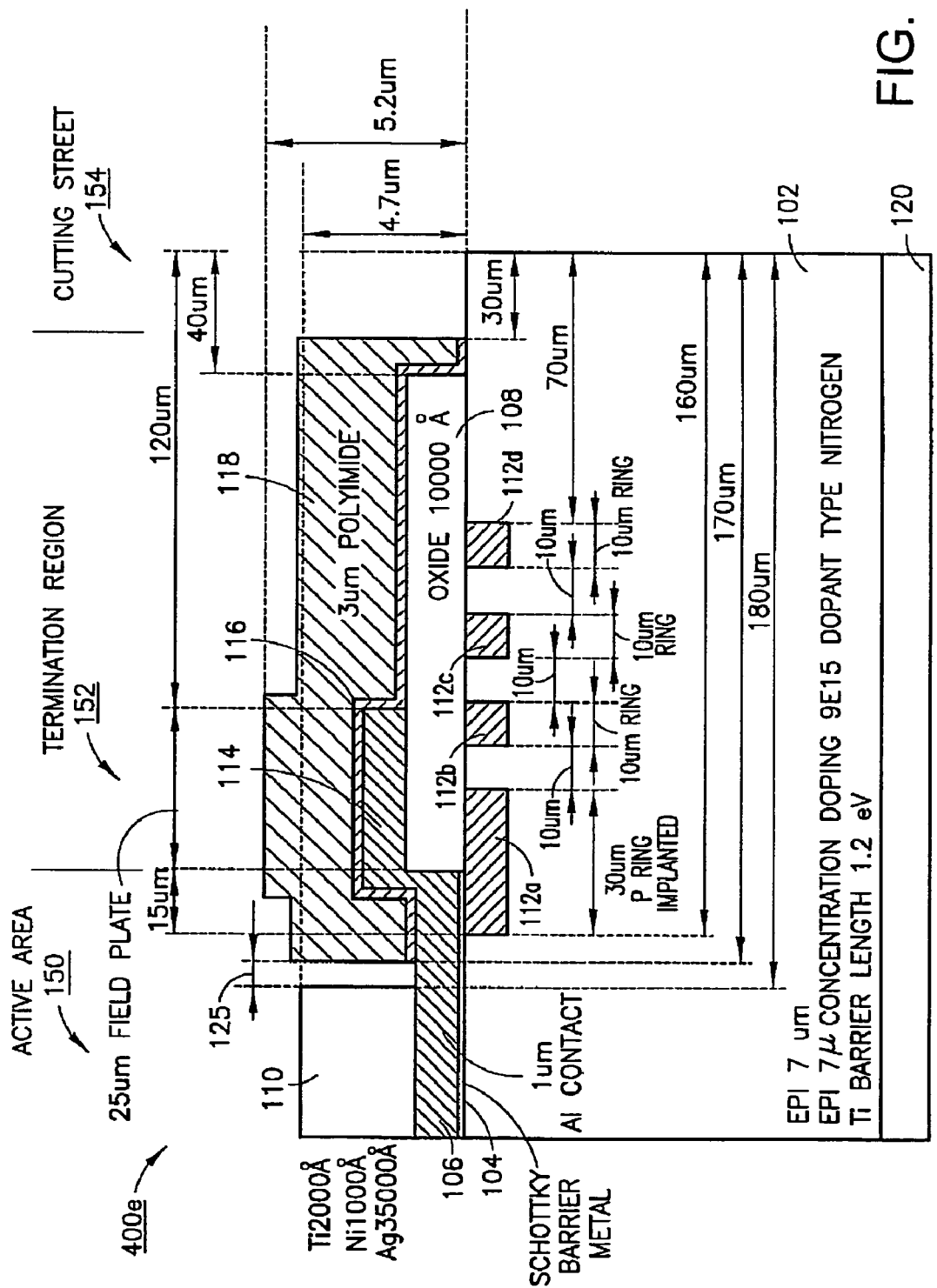

In overview, device 400a of FIG. 9A is similar to device 100b, for example, but now further includes an N⁺ diffusion 140 that laterally surrounds the die edge along cutting street 154. Devices 400b, 400c, and 400d of FIGS. 9B, 9C, and 9D include multiple stepped field oxide rings 108 and multiple stepped guard rings 112 of P⁺ conductivity, for example. Device 400e of FIG. 9E has a single field oxide ring 108 and multiple guard rings 112a-d, with rings 112b-d being floating guard rings.

One skilled in the art will also recognize that solderable contact 110, gap 125, and passivation layer 118 of the present invention are not limited to SiC Schottky diodes and are also applicable to other SiC power devices, such as MOSFETs. In addition, the present invention is also applicable to both vertical and lateral conduction devices. As an example, for a MOSFET with two or more electrodes on a top surface thereof, each electrode may include a solderable contact 110 of the present invention, with each solderable contact being spaced from an adjacent passivation layer(s) by a gap 125.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A Schottky diode comprising:
    a semiconductor wafer having a body region and a cathode electrode above the body region, wherein said cathode electrode is a bondable metal;
    an epitaxially formed region on the bottom of the body region;
    a barrier interface located beneath the epitaxially formed region;
    an anode contact located beneath the barrier interface, wherein said anode contact is a solderable metal;
    a package for said semiconductor wafer, said package comprising a conductive heat dissipation surface located beneath said anode, said anode contact is thermally connected and secured to said conductive heat dissipation surface; and
    a passivation mass is located between the epitaxially formed region and said conductive heat dissipation surface;
    wherein said solderable metal of said anode contact being a spaced distance from said passivation mass such that adjacent sides of said solderable metal and said passivation mass form a gap that extends to the bottom surface of said solderable metal.

2. The Schottky diode of claim 1, further comprising a solder paste located between and in contact with said anode contact and said conductive heat dissipation surface.

3. The Schottky diode of claim 1, wherein the body region comprises Silicon.

4. The Schottky diode of claim 3, wherein said conductive heat dissipation surface is a lead frame supporting the semiconductor wafer.

5. The Schottky diode of claim 3, wherein said package is a package having a shallow cup for receiving said die, said anode contact is connected to an interior of a top of said cup.

6. The Schottky diode of claim 3, further comprising:
    a guard ring diffusion in the bottom of said epitaxially formed region and surrounding said anode contact,
    wherein said passivation mass is disposed between the guard ring and the conductive heat dissipation surface.

7. The Schottky diode of claim 6, further comprising a solder paste located between and in contact with said anode contact and said conductive heat dissipation surface.

8. The Schottky diode of claim 1, wherein the body region comprises Silicon Carbide.

9. The Schottky diode of claim 8, wherein said conductive heat dissipation surface is a lead frame supporting the semiconductor wafer.

10. The Schottky diode of claim 8, wherein said package is a package having a shallow cup for receiving said die, said anode contact is connected to an interior of a top of said cup.

11. The Schottky diode of claim 8, further comprising a solder paste located between and in contact with said anode contact and said conductive heat dissipation surface.

12. The Schottky diode of claim 8, further comprising:
    a guard ring diffusion in the bottom of said epitaxially formed region and surrounding said anode contact,
    wherein said passivation mass is disposed between the guard ring and the conductive heat dissipation surface.

13. The Schottky diode of claim 12, wherein said conductive heat dissipation surface is a lead frame supporting the semiconductor wafer.

14. The Schottky diode of claim 12, wherein said package is a package having a shallow cup for receiving said die, said anode contact is connected to an interior of a top of said cup.

15. The Schottky diode of claim 12, further comprising a solder paste located between and in contact with said anode contact and said conductive heat dissipation surface.

\* \* \* \* \*